US012615920B2

(12) United States Patent
Lee et al.

(10) Patent No.: US 12,615,920 B2
(45) Date of Patent: Apr. 28, 2026

(54) DISPLAY APPARATUS INCLUDING A SECOND DISPLAY AREA HAVING SECOND HOLES CORRESPONSING TO SPACES BETWEEN SECOND PIXELS

(71) Applicant: Samsung Display Co., Ltd., Yongin-si (KR)

(72) Inventors: Junhee Lee, Yongin-si (KR); Chanyoung Kim, Yongin-si (KR); Eonjoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 380 days.

(21) Appl. No.: 18/300,770

(22) Filed: Apr. 14, 2023

(65) Prior Publication Data

US 2024/0008315 A1    Jan. 4, 2024

(30) Foreign Application Priority Data

Jun. 29, 2022    (KR) ........................ 10-2022-0079990

(51) Int. Cl.
| | |
|---|---|
| *H10K 59/122* | (2023.01) |
| *H10K 59/38* | (2023.01) |
| *H10K 59/65* | (2023.01) |
| *H10K 59/80* | (2023.01) |

(52) U.S. Cl.
CPC ........... *H10K 59/122* (2023.02); *H10K 59/38* (2023.02); *H10K 59/65* (2023.02); *H10K 59/8792* (2023.02)

(58) Field of Classification Search
None
See application file for complete search history.

(56) References Cited

U.S. PATENT DOCUMENTS

| | | | |
|---|---|---|---|
| 10,340,318 B2 | 7/2019 | Kim et al. | |
| 10,916,723 B2 | 2/2021 | Lee et al. | |
| 11,282,905 B2 | 3/2022 | Park et al. | |
| 2019/0165068 A1* | 5/2019 | Park .................... | H10K 59/126 |
| 2020/0293739 A1 | 9/2020 | Yang et al. | |
| 2021/0134911 A1 | 5/2021 | Park et al. | |
| 2021/0226174 A1 | 7/2021 | Kim et al. | |
| 2022/0190061 A1 | 6/2022 | Baek et al. | |
| 2022/0208863 A1 | 6/2022 | Cho et al. | |

(Continued)

FOREIGN PATENT DOCUMENTS

| | | |
|---|---|---|
| KR | 10-2018-0059280 | 6/2018 |
| KR | 10-2019-0063570 | 6/2019 |

(Continued)

*Primary Examiner* — Nduka E Ojeh
(74) *Attorney, Agent, or Firm* — Innovation Counsel LLP

(57) ABSTRACT

A display apparatus including a substrate including a display area including a first display area, and a second display area, first pixel electrodes disposed over the substrate in the first display area, second pixel electrodes disposed over the substrate in the second display area, and a pixel-defining layer including first pixel openings in the first display area and corresponding to the first pixel electrodes, second pixel openings in the second display area and corresponding to the second pixel electrodes, first holes in the first display area and corresponding to spaces between the first pixel electrodes, and second holes in the second display area and corresponding to spaces between the second pixel electrodes.

19 Claims, 7 Drawing Sheets

(56)        References Cited

U.S. PATENT DOCUMENTS

| | | | |
|---|---|---|---|
| 2023/0026941 A1* | 1/2023 | Lv ................... | H10K 59/80521 |
| 2023/0110236 A1* | 4/2023 | Jin ...................... | H10K 50/822 |
| | | | 257/89 |
| 2024/0040885 A1* | 2/2024 | Yang ..................... | H10K 59/38 |

FOREIGN PATENT DOCUMENTS

| | | |
|---|---|---|
| KR | 10-2021-0055128 | 5/2021 |
| KR | 10-2021-0093420 A | 7/2021 |
| KR | 10-2022-0085929 A | 6/2022 |
| KR | 10-2022-0097674 | 7/2022 |

* cited by examiner

FIG. 2

DISPLAY APPARATUS INCLUDING A SECOND DISPLAY AREA HAVING SECOND HOLES CORRESPONSING TO SPACES BETWEEN SECOND PIXELS

CROSS-REFERENCE TO RELATED APPLICATION(S)

This application claims priority to and benefits of Korean Patent Application No. 10-2022-0079990 under 35 U.S.C. § 119, filed on Jun. 29, 2022 in the Korean Intellectual Property Office (KIPO), the entire contents of which are incorporated herein by reference.

BACKGROUND

1. Technical Field

One or more embodiments relate to a display apparatus in which a high-quality image may be displayed.

2. Description of the Related Art

In general, a display apparatus has display elements in a display area to be used to display images. In recent years, various additional features have been added to such display apparatuses.

SUMMARY

However, conventional display apparatuses have had problems such as inability to display high-quality images, increased defects during manufacturing, and shortened life after manufacturing, due to features added to the display apparatus.

One or more embodiments include a display apparatus in which a high-quality image may be displayed. However, such goals are merely examples, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus may include a substrate including a display area including a first display area and a second display area, first pixel electrodes disposed over the substrate in the first display area, second pixel electrodes disposed over the substrate in the second display area, and a pixel defining layer including first pixel openings in the first display area and corresponding to the first pixel electrodes, second pixel openings in the second display area and corresponding to the second pixel electrodes, first holes in the first display area and corresponding to spaces between the first pixel electrodes, and second holes in the second display area and corresponding to spaces between the second pixel electrodes.

According to one or more embodiments, a display apparatus may further include first color filters disposed over the first pixel electrodes, a first black matrix contacting the first color filters and including first through holes corresponding to the first pixel openings and the first holes, second color filters disposed over the second pixel electrodes, and a second black matrix contacting the second color filters and including second through holes corresponding to the second pixel openings.

According to one or more embodiments, in plan view, a subset of the first through holes may overlap the first pixel openings, another of the first through holes may overlap the first holes, and the second through holes may overlap the second pixel openings.

According to one or more embodiments, in plan view, the second black matrix may overlap the second holes.

According to one or more embodiments, in plan view, the second holes may be in the second black matrix.

According to one or more embodiments, in plan view, a subset of the second color filters may be disposed over portions of the second black matrix overlapping the second holes.

According to one or more embodiments, in plan view, portions of the second black matrix overlapping the second holes may be covered by the second color filters.

According to one or more embodiments, in plan view, the second color filters may completely cover the second holes.

According to one or more embodiments, an area of each of first through holes corresponding to the first holes from among the first through holes may be greater than an area of a corresponding one among the first holes.

According to one or more embodiments, the first color filters may fill the first through holes.

According to one or more embodiments, the first black matrix and the second black matrix may be integrally formed as a single body.

According to one or more embodiments, an area of each of the first holes may be identical to an area of each of the second holes.

According to one or more embodiments, a shape of each of the first holes may be identical to a shape of each of the second holes.

According to one or more embodiments, the display apparatus may further include sensors disposed under the substrate to correspond to the first holes.

According to one or more embodiments, the sensors may be illuminance sensors.

According to one or more embodiments, the sensors may be infrared sensors.

According to one or more embodiments, a display apparatus may include a first display area of a substrate, a second display area of a substrate, first pixel electrodes disposed in the first display area, second pixel electrodes disposed in the second display area, at least one of an illuminance sensor and an infrared sensor disposed in the first display area, and a pixel-defining layer including first pixel openings in the first display area and corresponding to the first pixel electrodes, second pixel openings in the second display area and corresponding to the second pixel electrodes, first holes in the first display area and corresponding to spaces between the first pixel electrodes, and second holes in the second display area and corresponding to spaces between the second pixel electrodes.

Other aspects, features, and advantages will become apparent from the following detailed description, claims and drawings for carrying out the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 is a cross-sectional view schematically illustrating a portion of the display apparatus of FIG. 1;

DETAILED DESCRIPTION OF THE EMBODIMENTS

Figure 1:
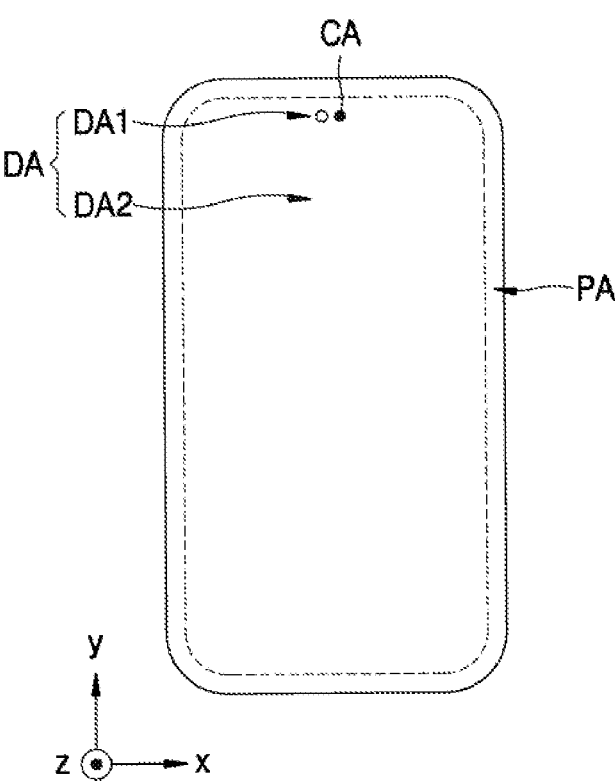
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the singular forms, "a," "an," and "the" are intended to include the plural forms as well, unless the context clearly indicates otherwise.

As used herein, the term "and/or" includes any and all combinations of one or more of the associated listed items. For example, "A and/or B" may be understood to mean any combination including "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that when a layer, region, or component is referred to as being "formed on" another layer, region, or component, it can be directly or indirectly formed on the other layer, region, or component. For example, intervening layers, regions, or components may be present. Sizes of components in the drawings may be exaggerated for convenience of explanation. In other words, since sizes and thicknesses of components in the drawings may be arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "connected to," "coupled to," "contacts," or the like, may include a physical and/or electrical connection.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view schematically illustrating a display apparatus according to an embodiment. The display apparatus according to an embodiment may be an electronic apparatus such as a device classified among smartphones, mobile phones, navigation devices, game consoles, TVs, vehicle head units, notebook computers, laptop computers, tablet computers, personal media players (PMP), or personal digital assistants (PDA). The electronic apparatus may be flexible. FIG. 1 shows an example in which the display apparatus according to an embodiment is a smartphone.

The display apparatus may include a display area DA and a peripheral area PA around the display area DA. When the display area DA is viewed in plan view, the display area DA may have a roughly rectangular shape, as shown in FIG. 1. The disclosure is not limited thereto, and the display area DA may have a polygonal shape such as a triangle, pentagon, or hexagon, a circular shape, an oval shape, or an atypical shape. The corner of the edge of the display area DA may have a round shape. A peripheral area PA may be a kind of non-display area where display elements may not be arranged. The entire display area DA may be surrounded by the peripheral area PA.

The display area DA may include pixels including various display elements such as organic light-emitting diodes (OLEDs). The pixels may be displayed in various forms such as striped, PenTile®, or mosaic arrangements along the x-axis direction and y-axis direction to display images.

A component area CA may be located in the display area DA. However, the disclosure is not limited thereto, and the component area CA may be located in the peripheral area PA. A component that is an electronic element may be arranged below (in a –z direction) a substrate (100, see FIG. 2) correspondingly to the component area CA. A component may be a camera, for example. The component area CA may include a transmission area that may transmit light and/or sound being output from the component to the outside or progressing from the outside to the component. Display elements may be arranged in the component area CA as needed so that an image may be displayed in the component area CA.

The display area DA may include a first display area DA1 and a second display area DA2. The second display area DA2 may have a shape surrounding the first display area DA1 as shown in FIG. 1. However, the disclosure is not limited thereto, and various modifications may be made to the display areas. For example, a part of the first display area DA1 may contact the peripheral area PA. For example, the second display area DA2 may surround at least part of the first display area DA1.

Display elements may be arranged in the first display area DA1 and the second display area DA2 to display images. The number of first display elements per unit area arranged in the first display area DA1 and the number of second display elements per unit area arranged in the second display area DA2 may be the same. Sensors disposed under the substrate 100 may be disposed in the first display area DA1. These sensors may be arranged to correspond to spaces between the display elements arranged in the first display area DA1. These sensors may be electronic elements that use light or sound. For example, the sensors may be proximity sensors for measuring distances or illuminance sensors for measuring brightness. Electronic elements using light may use light of various wavelength bands such as visible light, infrared light, or ultraviolet light.

FIG. 1 illustrates that the display area DA includes one first display area DA1. However, the disclosure is not limited thereto. The display area DA may include multiple first display areas DA1 that are apart from each other. A first display area DA1 may have an illuminance sensor under the substrate 100, and another may have a proximity sensor under the substrate 100. Hereinafter, for convenience, cases in which the display area DA includes one first display area DA1 are explained.

Figure 2:
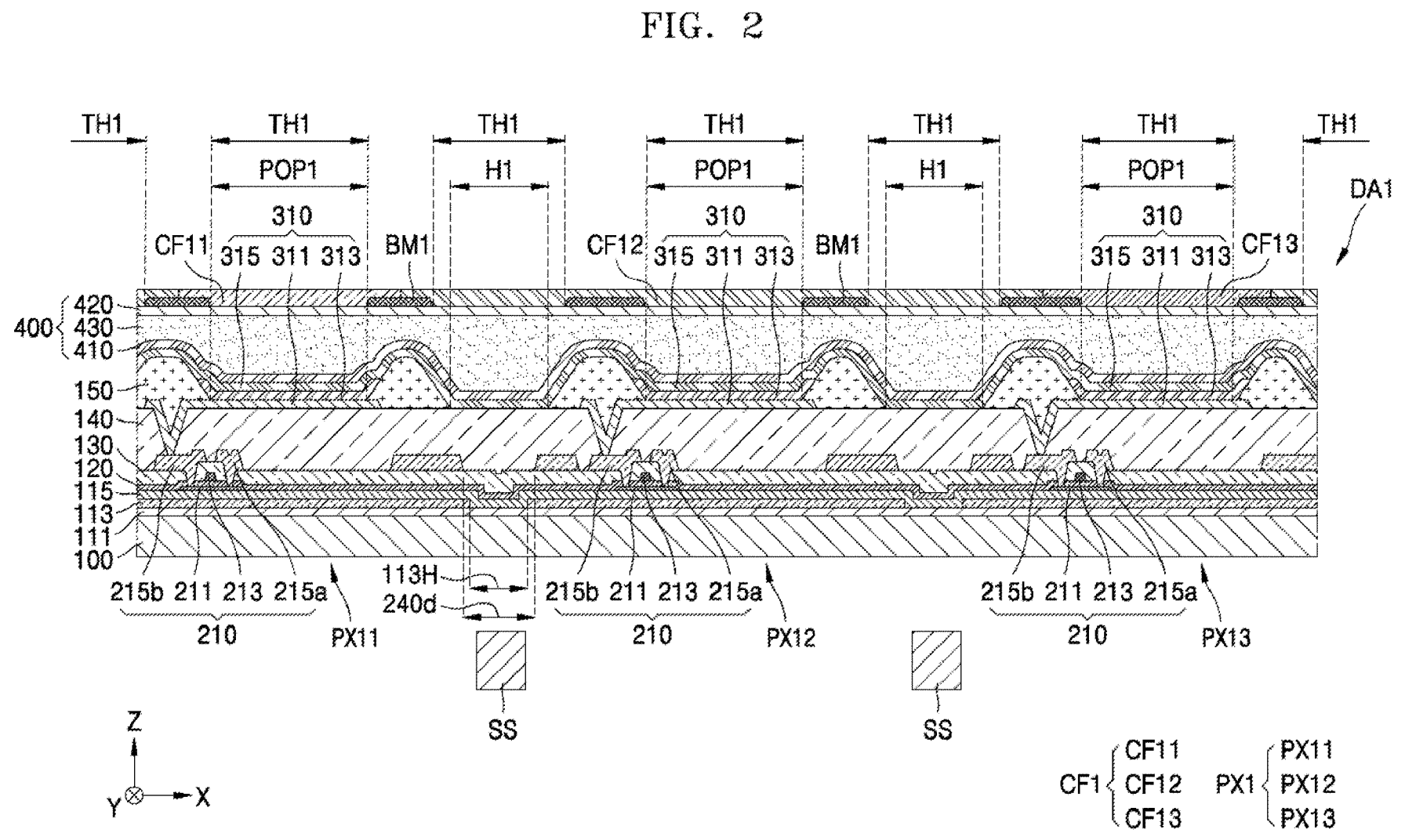

FIG. 2 is a cross-sectional view schematically illustrating a portion of the display apparatus of FIG. 1, and more specifically, is a cross-sectional view schematically illustrating a portion of the first display area DA1 of FIG. 1. As shown in FIG. 2, the display apparatus according to an embodiment has multiple first pixels PX1 arranged in the first display area DA1. FIG. 2 illustrates that the first pixels PX1 include the first first pixel PX11, the first second pixel PX12, and the first third pixel PX13. The description above is an example, and thus the display apparatus may have more pixels arranged in the first display area DA1. Although in FIG. 2, the first first pixel PX11 to the first third pixel PX13 are illustrated as being adjacent to each other, the disclosure is not limited thereto. For example, components such as other wirings may be arranged between the first first pixel PX11 to the first third pixel PX13. Accordingly, the first first pixel PX11 and the first second pixel PX12 may not be located adjacent to each other. In FIG. 2, the cross-sections of the first first pixel PX11 to the first third pixel PX13 may not be cross-sections viewed from the same direction.

The display apparatus according to an embodiment may be provided with the substrate 100. The substrate 100 may include glass, metal, or polymer resin. If the substrate 100 has a flexible or bendable characteristic, the substrate 100 may include, for example, a polymer resin such as polyethersulphone, polyacrylate, polyetherimide, polyethylene naphthalate, polyethylene terephthalate, polyphenylene sulfide, polyarylate, polyimide, polycarbonate, and/or cellulose acetate propionate. Various modifications may be made. For example, the substrate 100 may have a multi-layer structure including two layers each including a polymer resin and a barrier layer including an inorganic material (e.g., silicon oxide, silicon nitride, and/or silicon oxynitride) and located between the two layers.

In the first display area DA1 as shown in FIG. 2, multiple first pixels PX1 may be disposed over the substrate 100. Because each of the first pixels PX1 may include a first display element 310 having a first pixel electrode 311, it will be understood that multiple first pixel electrodes 311 may be disposed over the substrate 100 in the first display area DA1. In the first display area DA1, first thin-film transistors 210 electrically connected to the first display elements 310 may be placed on the substrate 100, in addition to the first display elements 310. For reference, FIG. 2 illustrates that organic light-emitting elements including the first pixel electrode 311, a first intermediate layer 313, and a first counter electrode 315 are disposed over the substrate 100 as the first display elements 310. In case that the organic light-emitting elements are electrically connected to the first thin-film transistor 210, it may mean that each of the first pixel electrodes 311 is electrically connected to the corresponding first thin-film transistor 210.

The first thin-film transistor 210 may include a first semiconductor layer 211, a first gate electrode 213, a first source electrode 215a, and a first drain electrode 215b, the first semiconductor layer 211 including an amorphous silicon, a polycrystalline silicon, an organic semiconductor material, and/or an oxide semiconductor material. The first gate electrode 213 may include various conductive materials and have various layered structures, including a molybdenum (Mo) layer and an aluminum (Al) layer. In some embodiments, the first gate electrode 213 may include a titanium nitride ($TiN_x$) layer, an Al layer, and/or a titanium (Ti) layer. Each of the first source electrode 215a and the first drain electrode 215b may also include various conductive materials and have various layered structures, for example, a Ti layer, an Al layer, and/or a Cu layer.

To ensure insulation between the first semiconductor layer 211 and the first gate electrode 213, a gate insulation layer 120 may be disposed between the first semiconductor layer 211 and the first gate electrode 213, the gate insulation layer 120 including an inorganic material such as a silicon oxide, a silicon nitride, and/or a silicon oxynitride. Furthermore, an interlayer insulation layer 130 may be disposed over the first gate electrode 213, and the first source electrode 215a and the first drain electrode 215b may be disposed over the interlayer insulation layer 130, the interlayer insulation layer 130 including an inorganic material such as a silicon oxide, a silicon nitride, and/or a silicon oxynitride. The insulation layer including the inorganic material may be formed by chemical vapor deposition (CVD) or atomic layer deposition (ALD). This is also true for embodiments to be described later and modifications thereof.

In FIG. 2, the first thin-film transistor 210 includes the first source electrode 215a and the first drain electrode 215b. However, the disclosure is not limited thereto. For example, the first source electrode 215a and/or the first drain electrode 215b may be part of a wiring. In other embodiments, the first thin-film transistor 210 may not include the first source electrode 215a and/or the first drain electrode 215b, and a source area of the first semiconductor layer 211 may act as a source electrode or a drain area of the first semiconductor layer 211 may act as a drain electrode. For example, the source area of the first semiconductor layer 211 of the first thin-film transistor 210 may be integrated with the drain area of another thin-film transistor, in which case the drain electrode of the other thin-film transistor may be electrically connected to the source electrode of the first thin-film transistor 210.

In addition to the first source electrode 215a and the first drain electrode 215b, wirings may also be arranged on the interlayer insulation layer 130. Spacings 240d may be maintained between the wirings so that sensors SS described below and disposed under the substrate 100 may obtain data by using light, etc. through spaces between the wirings.

A first buffer layer 111 may be disposed between the first thin-film transistor 210 having the structure described above and the substrate 100, the first buffer layer 111 including an inorganic material such as a silicon oxide, a silicon nitride, and/or a silicon oxynitride. The first buffer layer 111 may increase the smoothness of an upper surface of the substrate 100 or prevent or minimize the permeation of impurities from the substrate 100 or the like through the first semiconductor layer 211 of the first thin-film transistor 210.

A second buffer layer 115 may be arranged between the first thin-film transistor 210 and the first buffer layer 111, and a lower metal layer 113 may be arranged between the first buffer layer 111 and the second buffer layer 115. The second buffer layer 115 may include an inorganic material such as a silicon oxide, a silicon nitride, and/or a silicon oxynitride. The lower metal layer 113 may include Ti, AL, CU, or MO. The lower metal layer 113 may minimize electromagnetic wave or light from the outside from affecting the first thin-film transistor 210 or the like. The lower metal layer 113 has holes 113H located in the first display area DA1. Through these holes 113H, the sensors SS described below and disposed under the substrate 100 may obtain data by using light and the like.

A planarization layer 140 may be disposed over the first thin-film transistor 210. For example, as shown in FIG. 2, in case that an organic light-emitting element is arranged on the first thin-film transistor 210, the planarization layer 140 may have a substantially flat upper surface so that the organic light-emitting element may be disposed over the substantially flat upper surface of the planarization layer 140. For example, the planarization layer 140 may include an organic material, such as acryl, benzocyclobutene (BCB), and/or hexamethyldisiloxane (HMDSO). In FIG. 2, the planarization layer 140 is a single layer. However, the planarization layer 140 may include layers, and various modifications may be made.

In the first display area DA1, the first display element 310 may be disposed over the planarization layer 140 of the substrate 100. The organic light-emitting element as shown in FIG. 2 may be used as the first display element 310. As described above, the organic light-emitting element included in each of the first display elements 310 may include a first intermediate layer 313 located between the first pixel electrode 311 and the first counter electrode 315 and including an emission layer.

As shown in FIG. 2, the first pixel electrode 311 may contact either the first source electrode 215a or the first drain electrode 215b via an opening formed in the planarization layer 140 and be electrically connected to the first thin-film transistor 210. Each of the first pixel electrodes 311 may include a light-transmitting conductive layer and a reflective layer, in which the light-transmitting conductive layer includes a light-transmitting conductive oxide, such as indium tin oxide (ITO), indium oxide ($In_2O_3$), and/or indium zinc oxide (IZO), and the reflective layer includes metal such as Al or silver (Ag). For example, each of the first pixel electrodes 311 may have a three-layer structure of an ITO layer, an Ag layer, and another ITO layer.

The first intermediate layer 313 including the emission layer may be disposed over the corresponding first pixel electrode 311. The first intermediate layer 313 may include a low molecular weight material or a high molecular weight material. If the first intermediate layer 313 includes a low molecular weight material, the first intermediate layer 313 may have a structure in which a hole injection layer (HIL), a hole transport layer (HTL), an emission layer (EML), an electron transport layer (ETL), an electronic injection layer (EIL), or the like are stacked on each other, and may be formed by vacuum deposition. In case that the first intermediate layer 313 includes a high molecular weight material, the first intermediate layer 313 may have a structure including e an HTL and an EML. The HTL may include poly(ethylenedioxythiophene) (PEDOT), and the emission layer may include a high-molecular weight material such as a polyphenylene vinylene (PPV)-based material or a polyfluorene-based material. The first intermediate layer 313 may be formed via screen printing, inkjet printing, vapor deposition, laser induced thermal imaging (LITI), or the like. The first intermediate layer 313 is not limited thereto, and may have any of various other structures.

The layers of the first intermediate layer 313 other than the emission layer may be formed integrally as a single body over the multiple first pixel electrodes 311. The emission layer included in the first intermediate layer 313 may be disposed over a corresponding first pixel electrode 311. The emission layer located in the first first pixel PX11 may emit, for example, red light, the emission layer located in the first second pixel PX12 may emit, for example, green light, and the emission layer located in the first third pixel PX13 may emit, for example, blue light.

The first counter electrode 315 disposed over the first intermediate layer 313 may be formed integrally as a single body over the multiple first pixel electrodes 311. The first counter electrode 315 may include a light-transmitting conductive layer including ITO, $In_2O_3$, and/or IZO, and may include a semi-transmissive layer including metal such as Al or Ag. For example, the first counter electrode 315 may include a semi-transmissive layer including MgAg.

A pixel defining layer 150 may be disposed over the planarization layer 140. The pixel defining layer 150 may include a first pixel opening POP1 corresponding to each of the first pixels PX1 in the first display area DA1, for example, the first pixel opening POP1 that exposes at least a central portion of each of the first pixel electrodes 311, thereby defining a pixel. As in FIG. 2, the pixel defining layer 150 increases a distance between an edge of each of the first pixel electrodes 311 and the first counter electrode 315 to thereby prevent an arc or the like from occurring on the edges of the first pixel electrodes 311. The pixel defining layer 150 may include first holes H1 corresponding to spaces between the first pixel electrodes 311 in the first display area DA1. Through the first holes H1, the sensors SS described below and disposed under the substrate 100 may obtain data by using light and the like.

The pixel defining layer 150 may be formed of an organic material such as polyimide or HMDSO. The pixel defining layer 150 may include a shading insulating material. Accordingly, the pixel defining layer 150, which is a colored opaque shading insulating layer, may appear, for example, black. For example, the pixel defining layer 150 may include a polyimide (PI) binder and a pigment mixture of red, green, and blue. In other embodiments, the pixel defining layer 150 may include a mixture of a binder, a lactam black pigment, and a blue pigment. In other embodiments, the pixel defining layer 150 may include carbon black. The pixel defining layer 150 may improve the contrast of the display device.

Because the organic light-emitting element may be damaged by moisture or oxygen from the outside, as shown in FIG. 2, an encapsulation layer 400 including a first inorganic encapsulation layer 410, a second inorganic encapsulation layer 420, and an organic encapsulation layer 430 located therebetween may cover the organic light-emitting elements to protect them.

Each of the first inorganic encapsulation layer 410 and the second inorganic encapsulation layer 420 may include at least one inorganic insulating material. The inorganic insulating material may be aluminum oxide, titanium oxide, tantalum oxide, hafnium oxide, zinc oxide, silicon oxide, silicon nitride, and/or silicon oxynitride.

The organic encapsulation layer 430 may include a polymer-based material. Examples of the polymer-based material are an acryl-based resin, an epoxy-based resin, polyimide, and/or polyethylene. For example, the organic encapsulation layer 430 may include an acryl-based resin, such as a polymethylmethacrylate and/or polyacrylic acid. The organic encapsulation layer 430 may be formed by curing a monomer or coating a polymer.

In the first display area DA1, an anti-reflection layer may be disposed over the encapsulation layer 400. The anti-reflection layer may include first color filters CF1 and a first black matrix BM1.

The first black matrix BM1 of the anti-reflection layer may include first through holes TH1 located in the first display area DA1. The first through holes TH1 of the first black matrix BM1 may correspond to the first pixel openings POP1 and the first holes H1 of the pixel defining layer 150.

Each of the first through holes TH1 that corresponds to the first pixel openings POP1 of the pixel defining layer 150 among the first through holes TH1 of the first black matrix BM1 may have an area the same as or greater than that of a corresponding one among first pixel opening POP1. In FIG. 2, each of the first through holes TH1 that corresponds to the first pixel openings POP1 of the pixel defining layer 150 among the first through holes TH1 of the first black matrix BM1 is illustrated to have the same area as that of a corresponding first pixel opening POP1.

Each of the first through holes TH1 that corresponds to the first holes H1 of the pixel defining layer 150 among the first through holes TH1 of the first black matrix BM1 may have an area the same as or greater than that of a corresponding first hole H1. Through the first through holes TH1 corresponding to the first holes H1, the sensors SS described below and disposed under the substrate 100 may obtain data by using light and the like. In FIG. 2, each of the first through holes TH1 that corresponds to the first holes H1 of the pixel defining layer 150 among the first through holes TH1 of the first black matrix BM1 is illustrated to have an area the same as or greater than that of a corresponding first hole H1. This further enhances the sensitivity of the sensor SS.

The first color filters CF1 may fill the first through holes TH1 of the first black matrix BM1. Accordingly, the first black matrix BM1 contact the first color filters CF1. The first color filters CF1 may include a first first color filter CF11, a first second color filter CF12, and a first third color filter CF13. The first color filter CF1 may transmit light from the display element disposed under the first color filter CF1 such that only light of wavelength belonging to a particular wavelength band passes through the first color filter CF1.

FIG. 2 illustrates that the first first color filter CF11, which is a red color filter through which red light passes, may be located in the first first pixel PX11, which may be a red pixel, to thereby fill the first through hole TH1 of the first black matrix BM1 corresponding to the first pixel opening POP1 of the pixel defining layer 150, the first second color filter CF12, which is a green color filter through which green light passes, may be located in the first second pixel PX12, which may be a green pixel, to thereby fill the first through hole TH1 of the first black matrix BM1 corresponding to the first pixel opening POP1 of the pixel defining layer 150, and the first third color filter CF13, which is a blue color filter through which blue light passes, may be located in the first third pixel PX13, which may be a blue pixel, to thereby fill the first through hole TH1 of the first black matrix BM1 corresponding to the first pixel opening POP1 of the pixel defining layer 150.

The first color filters CF1 may reduce external light reflection in the display apparatus. For example, in case that external light reaches the first first color filter CF11, light having a wavelength belonging to the wavelength band of red light may pass through the first first color filter CF11, and light of other wavelengths may be absorbed into the first first color filter CF11. Therefore, light having a wavelength belonging to the wavelength band of red light among light incident into the display apparatus may pass through the first first color filter CF11, and some of the light passing through the first first color filter CF11 may be reflected on the first counter electrode 315 or the first pixel electrode 311 that is under the first first color filter CF11, and may be emitted to the outside. As a result, because only some of the external light incident into where the first first pixel PX11 is located is reflected to the outside, external light reflection may be reduced. The above description may also be applied to the first second color filter CF12 and the first third color filter CF13.

The first color filters CF1 may cover the first black matrix BM1. For example, the first color filters CF1 may cover an upper surface of the first black matrix BM1 in a direction that is far from the substrate 100 (+z direction). The first black matrix BM1 may prevent external light from progressing into the first display element 310, but external light may be partially reflected on the upper surface of the first black matrix BM1. Therefore, by covering the upper surface of the first black matrix BM1 with a material having a lower reflectance than that of the first black matrix BM1, the amount of external light that is reflected may further be reduced. Because the reflectance of the first black matrix BM1 is about 4%, the first color filters CF1 that have a reflectance of about 3% may cover the first black matrix BM1.

The first through holes TH1 among the first through holes TH1 of the first black matrix BM1, corresponding to the first holes H1 of the pixel defining layer 150, may be filled with the first color filters CF1. FIG. 2 illustrates that the first second color filter CF12 fills the first through holes TH1 among the first through holes TH1 of the first black matrix BM1, corresponding to the first holes H1 of the pixel defining layer 150. Accordingly, external light reflectance of a portion where the first hole H1 is located may be lowered.

The first black matrix BM1 may include a shading insulating material. Accordingly, the first black matrix BM1, which is a colored opaque shading insulating layer, may appear, for example, black. For example, the first black matrix BM1 may include a polyimide (PI) binder and a pigment mixture of red, green, and blue. In other embodiments, the first black matrix BM1 may include a mixture of a binder resin, a lactam black pigment, and a blue pigment. Or the first black matrix BM1 may include carbon black.

The sensors may be located in the first display area DA1. Specifically, the sensors SS may be disposed under the substrate 100 (−z direction) to correspond to the first holes H1 of the pixel defining layer 150. The sensors SS may obtain data by using light or the like through the holes 113H of the lower metal layer 113, spaces between wirings having spacings 240d, the first holes H1 of the pixel defining layer 150, and the first through holes TH1 of the first black matrix BM1. In FIG. 2, the sensors SS are shown to be apart from each other, and the sensors SS may be arranged on one base.

This sensor SS may be an illuminance sensor or a proximity sensor.

The illuminance sensor may sense the illuminance of ambient light of the display apparatus. The display apparatus may control the operation of the display elements according to illuminance information sensed by the illuminance sensor. For example, the display apparatus may increase the luminance of light emitted from the display elements in case that surrounding luminance is high, and may reduce the luminance of light emitted from the display elements in case that the surrounding luminance is low.

The proximity sensor may detect objects around the display device. The display apparatus may control the operation of the display elements according to information sensed by the proximity sensor. For example, if the display apparatus is a mobile phone and the display apparatus detects, through the proximity sensor, that a user places the display apparatus near his/her ear to call, the display apparatus may reduce the power consumption thereof by preventing the display elements from emitting light. If the proximity sensor confirms that the display apparatus is not located near the user's ear, the display apparatus may allow the display elements to emit light. If necessary, the display apparatus may further include an infrared light-emitting element (not shown), and the proximity sensor may recognize infrared rays released from the infrared light-emitting element and reflected on the object located near the display apparatus.

Figure 3:
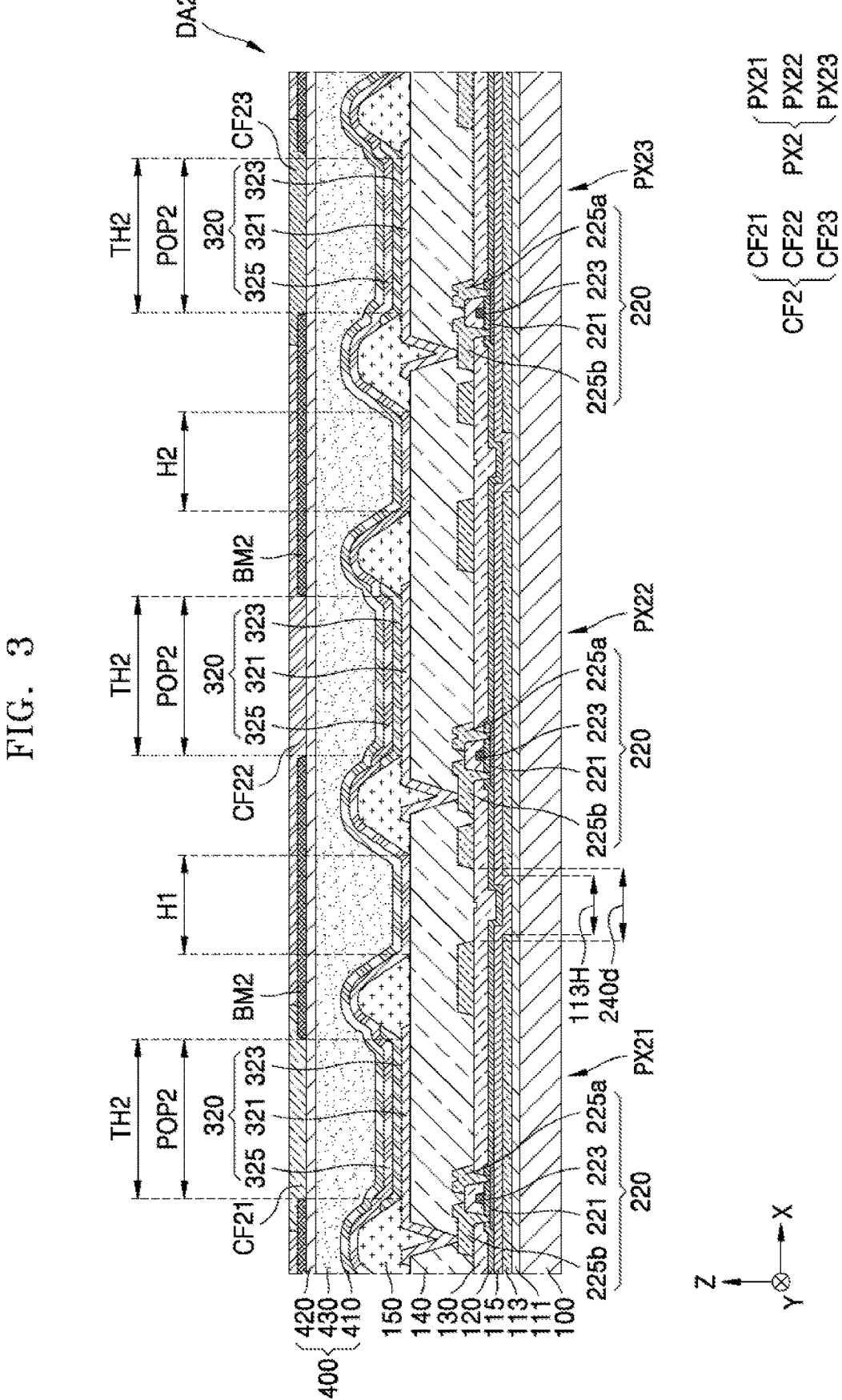
FIG. 3 is a cross-sectional view schematically illustrating another portion of the display apparatus of FIG. 1.

FIG. 3 is a cross-sectional view schematically illustrating another portion of the display apparatus of FIG. 1, and more specifically, is a cross-sectional view schematically illustrating a portion of the second display area DA2 of FIG. 1. As shown in FIG. 3, the display apparatus according to an embodiment has multiple second pixels PX2 arranged in the second display area DA2. FIG. 3 illustrates that the second pixels PX2 include a second first pixel PX21, a second second pixel PX22, and a second third pixel PX23. The description above is an example, and thus the display apparatus may have more pixels arranged in the second display area DA1. Although in FIG. 3, the second first pixel PX21 to the second third pixel PX23 are illustrated as being adjacent to each other, the disclosure is not limited thereto. For example, components such as other wirings may be arranged between the second first pixel PX21 to the second third pixel PX23. Accordingly, the second first pixel PX21 and the second second pixel PX22 may not be located adjacent to each other. In FIG. 3, the cross-sections of the second first pixel PX21 to the second third pixel PX23 may not be cross-sections viewed from the same direction.

In the second display area DA2 as shown in FIG. 3, multiple second pixels PX2 may be disposed over the substrate 100. Because each of the second pixels PX2 includes a second display element 320 having a second pixel electrode 321, it will be understood that multiple second pixel electrodes 321 may be disposed over the substrate 100 in the second display area DA2. In the second display area DA2, second thin-film transistors 220 electrically connected to the second display elements 320 may be placed on the substrate 100, in addition to the second display elements 320. For reference, FIG. 3 illustrates that organic light-emitting elements including the second pixel electrode 321, a second intermediate layer 323, and a second counter electrode 325 are disposed over the substrate 100 as the second display elements 320. In case that the organic light-emitting elements are electrically connected to the second thin-film transistor 220, it may mean that each of the second pixel electrodes 321 is electrically connected to the corresponding second thin-film transistor 220.

Descriptions of the second thin-film transistor 220 including a second semiconductor layer 221, a second gate electrode 223, a second source electrode 225a, and a second drain electrode 225b may be the same or similar to the first thin-film transistor 210 described with reference to FIG. 2. Descriptions of the second display element 320 including organic light-emitting devices including a second pixel electrode 321, a second intermediate layer 323, and a second counter electrode 325 may be the same or similar to the first display element 310 described with reference to FIG. 2. The second counter electrode 325 may be integrated with the first counter electrode 315.

The number of first display elements 310 per unit area arranged in the first display area DA1 and the number of second display elements 320 per unit area arranged in the second display area DA2 may be the same. Accordingly, images of uniform quality may be displayed across the first display area DA1 and the second display area DA2.

The pixel defining layer 150 disposed over the planarization layer 140 may include a second pixel opening POP2 corresponding to each of the second pixels PX2 in the second display area DA2, for example, a second pixel opening POP2 that exposes at least a central portion of each of the second pixel electrodes 321, as shown in FIG. 3. The pixel defining layer 150 may include second holes H2 corresponding to spaces between the second pixel electrodes 321 in the second display area DA2.

Unlike the first display area DA1, sensors SS (refer to FIG. 2) may not be arranged in the second display area DA2. Therefore, not including the second holes H2 in the pixel defining layer 150 in the second display area DA2 may be considered. However, when comparing portions of the same area of the first display area DA1 and the second display area DA2, the volume of the pixel defining layer 150 in the corresponding portion of the first display area DA1 may be less than the volume of the pixel defining layer 150 in the corresponding portion of the second display area DA2. Outgas may occur in the pixel defining layer 150 during manufacturing and/or during the process of use after the manufacturing, and in case that the volume of the pixel defining layer 150 changes, the amount of outgas that occurs may change.

A shrinkage in which the volume of the emission layer is decreased due to the influence of the outgas from the pixel defining layer 150 may occur in the emission layer of the first intermediate layer 313 included in the first display element 310 and the emission layer of the second intermediate layer 323 included in the second display element 320. In case that the degree of shrinkage is different among the display elements, even if data for emitting light with the same luminance is applied to the display elements, the display elements may emit light with different luminance. This may cause deterioration in the quality of a displayed image.

However, in the case of the display apparatus according to an embodiment, the pixel defining layer 150 may include the second holes H2 corresponding to spaces between the second pixel electrodes 321 in the second display area DA2 in which the sensors SS may not be arranged. Accordingly, when comparing the same area of first first display area DA1 and the second display area DA2, the volumes of the pixel defining layers 150 of the first display area DA1 and the second display area DA2 may be similar to or the same as each other. Therefore, even if shrinkage of the emission layer occurs, the same or similar degree of shrinkage may occur in the first display element 310 and the second display element 320. Therefore, a display device that always displays a high-quality image may be implemented.

To this end, an area of each of the first holes H1 of the pixel defining layer 150 located in the first display area DA1 may be identical to an area of each of the second holes H2 of the pixel defining layer 150 located in the second display area DA2. A shape of each of the first holes H1 of the pixel defining layer 150 located in the first display area DA1 may be identical to a shape of each of the second holes H2 of the pixel defining layer 150 located in the second display area DA2.

As in the first display area DA1, in the second display area DA2, an anti-reflection layer may be disposed over the encapsulation layer 400. The anti-reflection layer may include second color filters CF2 and a second black matrix BM2.

The second black matrix BM2 of the anti-reflection layer may include second through holes TH2 located in the second display area DA2. The second through holes TH2 of the second black matrix BM2 may correspond to the second pixel openings POP2 of the pixel defining layer 150. For example, as shown in FIG. 3, the second black matrix BM2 may not include through holes corresponding to the second holes H2 of the pixel defining layer 150. Accordingly, entrance of external light into the display apparatus may be further minimized.

A width of each of the second through holes TH2 of the second black matrix BM2 may be greater than or equal to a width of a corresponding second pixel opening POP2. FIG. 3 illustrates that a width of each of the second through holes TH2 of the second black matrix BM2 is equal to a width of the second pixel opening POP2 corresponding to each of the second through holes TH2.

The second color filters CF2 may fill the second through holes TH2 of the second black matrix BM2. Accordingly, the second black matrix BM2 may contact the second color filters CF2. The second color filters CF2 may include a second first color filter CF21, a second second color filter CF22, and a second third color filter CF23. The second color filter CF2 may transmit light from the display element disposed under the second color filter CF2 such that only light of wavelength belonging to a particular wavelength band transmits the second color filter CF2. The description of the first color filters CF1 including the first first color filter CF11, the first second color filter CF12, and the first third color filter CF13 may apply to the second color filters CF2 including the second first color filter CF21, the second second color filter CF22, and the second third color filter CF23. The second color filters CF2 may also cover the second black matrix BM2.

Figure 4:
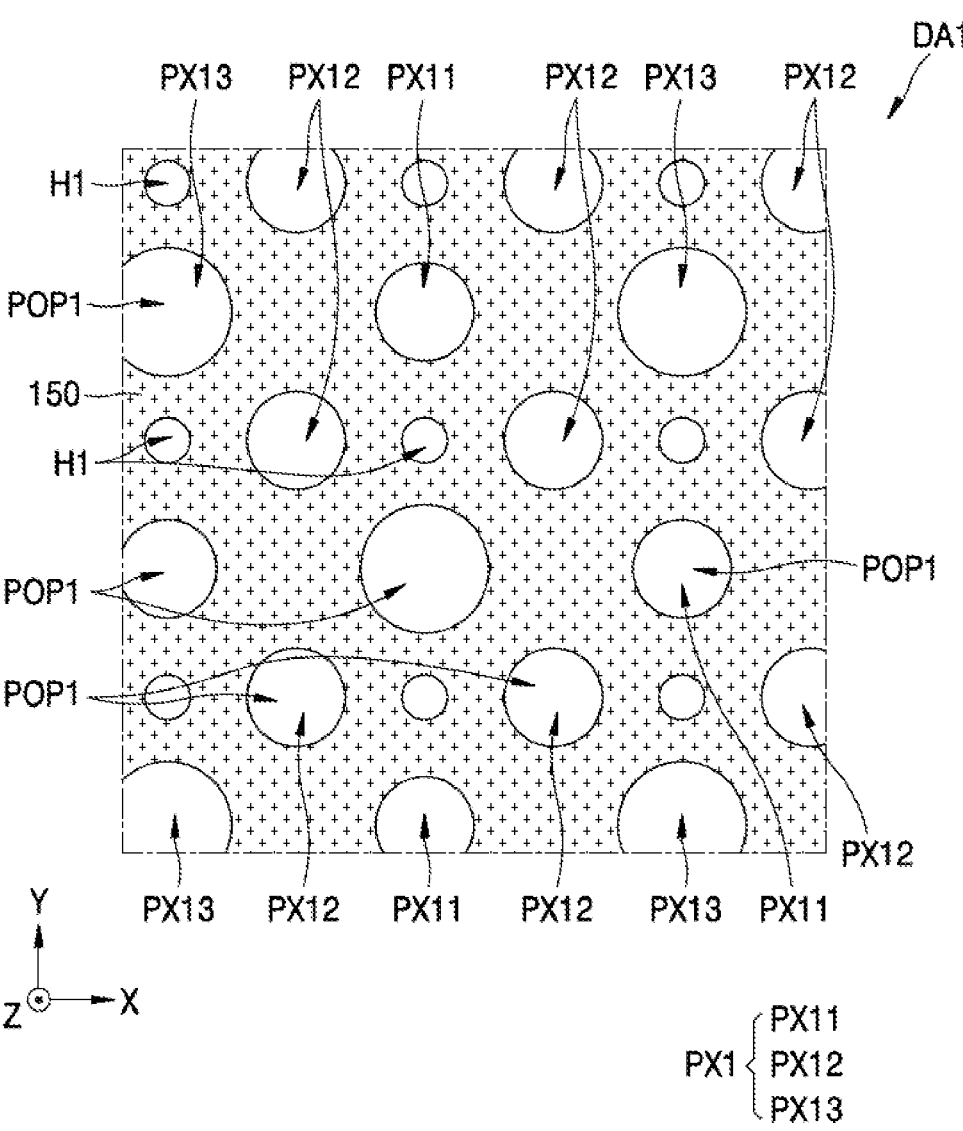
FIG. 4 is a plan view schematically illustrating a portion of the display apparatus of FIG. 2.
Figure 5:
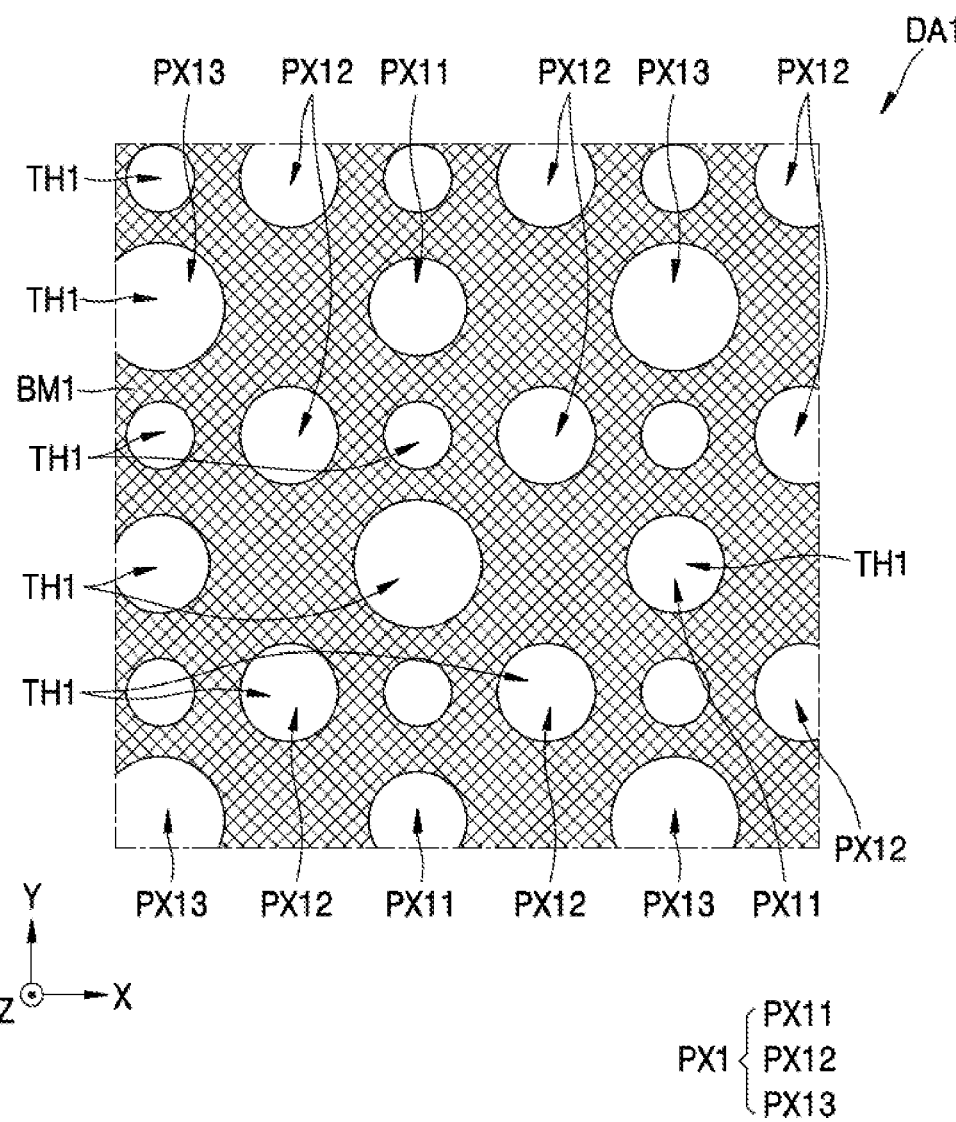
FIG. 5 is a plan view schematically illustrating another portion of the display apparatus of FIG. 2.
Figure 7:
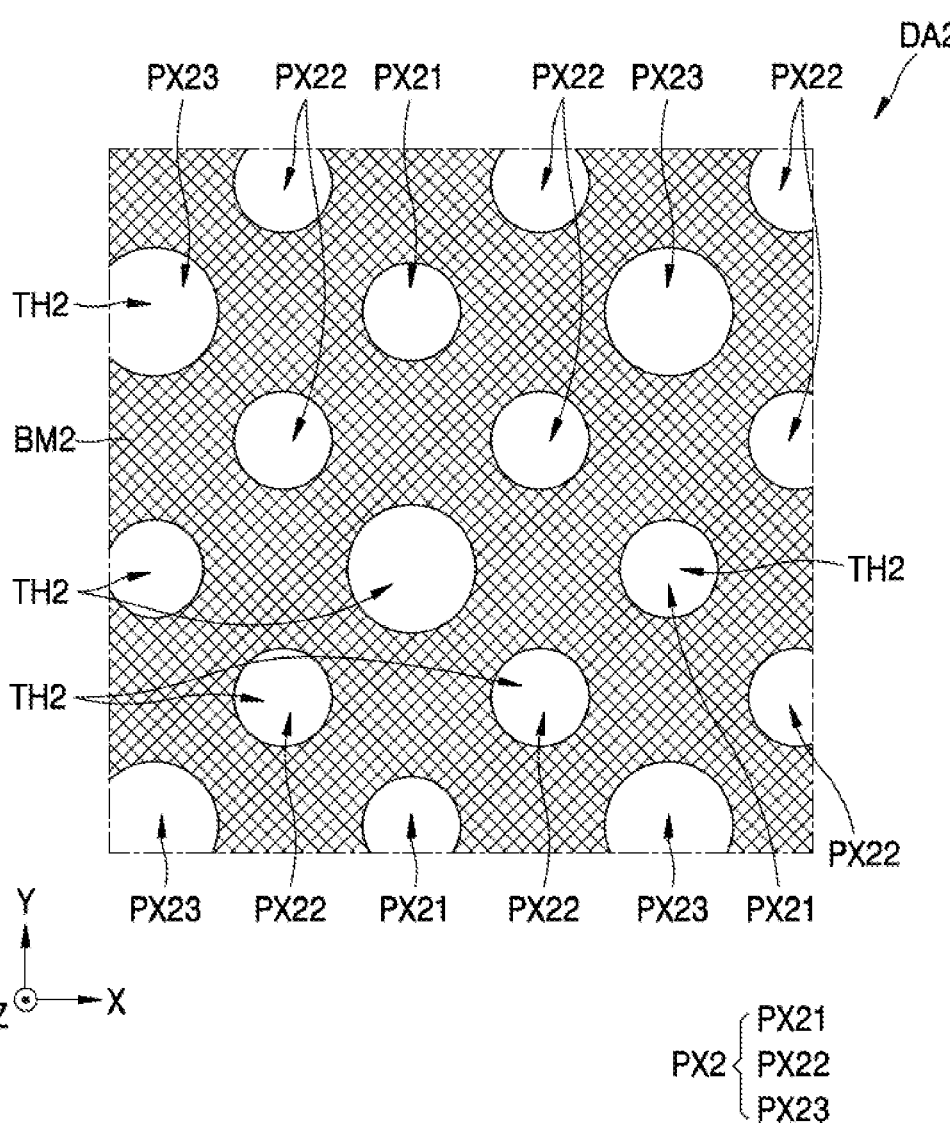
FIG. 7 is a plan view schematically illustrating another portion of the display apparatus of FIG. 3.

FIG. 4 is a plan view schematically illustrating a pixel defining layer 150 in the first display area DA1, and FIG. 5 is a plan view schematically illustrating the first black matrix BM1 in the first display area DA1. FIG. 7 is a plan view schematically illustrating a pixel defining layer 150 in the second display area DA2, and FIG. 7 is a plan view schematically illustrating the second black matrix BM2 in the second display area DA2. The first black matrix BM1 and the second black matrix BM2 may be integrally formed as a single body over the first display area DA1 and the second display area DA2 in the same manner as the pixel defining layer 150 or the like is formed as a single body over the first display area DA1 and the second display area DA2.

Figure 6:
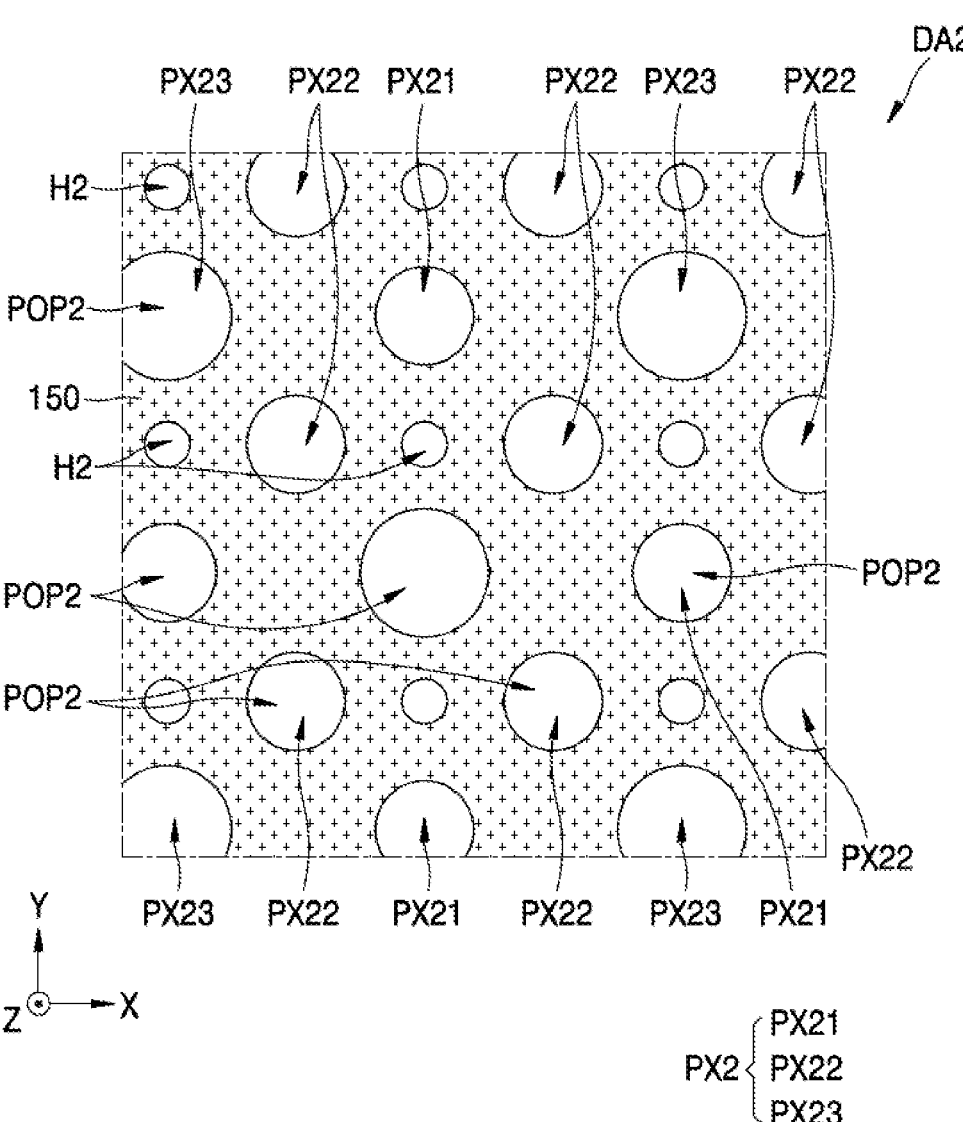
FIG. 6 is a plan view schematically illustrating a portion of the display apparatus of FIG. 3.

As shown in FIGS. 2, 4, and 5, when viewed from a direction perpendicular to the substrate 100 (z-axis direction, in plan view), some of the first through holes TH1 of the first black matrix BM1 overlap the first pixel openings POP1 of the pixel defining layer 150, and the others of the first through holes TH1 of the first black matrix BM1 may overlap the first holes H1 of the pixel defining layer 150. As shown in FIGS. 3, 6, and 7, the second through holes TH2 of the second black matrix BM2 may overlap the second pixel openings POP2 of the pixel defining layer 150. As shown in FIGS. 3, 6, and 7, in plan view (z-axis direction), the second black matrix BM2 may overlap the second holes H2 of the pixel defining layer 150. For example, in plan view (z-axis direction), the second holes H2 of the pixel defining layer 150 are located in the second black matrix BM2.

As described above, the second color filters CF2 may cover the second black matrix BM2 to reduce external light reflection. In plan view (z-axis direction), some of the second color filters CF2 may be disposed over portions of the second black matrix BM2 overlapping the second holes H2 of the pixel defining layer 150. FIG. 3 illustrates that the second second color filter CF22 may be disposed over portions of the second black matrix BM2 overlapping the second holes H2 of the pixel defining layer 150. As such, in plan view (z-axis direction), portions of the second black matrix BM2 overlapping the second holes H2 of the pixel defining layer 150 may be covered by the second color filters CF2. This may be understood that, when viewed in plan view (z-axis direction), the second color filters CF2 may completely cover the second holes H2 of the pixel defining layer 150.

As described above, one or more embodiments are described with reference to the embodiments shown in the drawings, which are merely examples, and those skilled in the art will understand that various modifications and equivalent other embodiments are possible therefrom.

According to an embodiment of the disclosure configured as described above, a display apparatus in which a high-quality image may be displayed may be implemented. The scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus comprising:
a substrate comprising a display area comprising:
a first display area; and
a second display area;
first pixel electrodes disposed over the substrate in the first display area;
second pixel electrodes disposed over the substrate in the second display area; and
a pixel-defining layer contacting the first pixel electrodes and the second pixel electrodes and comprising:
first pixel openings in the first display area and corresponding to the first pixel electrodes;
second pixel openings in the second display area and corresponding to the second pixel electrodes;
first holes in the first display area and corresponding to spaces between the first pixel electrodes; and second holes in the second display area and corresponding to spaces between the second pixel electrodes.

2. The display apparatus of claim 1, further comprising:

first color filters disposed over the first pixel electrodes;

a first black matrix contacting the first color filters and comprising first through holes corresponding to the first pixel openings and the first holes;

second color filters disposed over the second pixel electrodes; and a second black matrix contacting the second color filters and comprising second through holes corresponding to the second pixel openings.

3. The display apparatus of claim 2, wherein in plan view:

a subset of the first through holes overlap the first pixel openings, another subset of the first through holes overlap the first holes, and the second through holes overlap the second pixel openings.

4. The display apparatus of claim 2, wherein in plan view, the second black matrix overlaps the second holes.

5. The display apparatus of claim 2, wherein in plan view, the second holes are in the second black matrix.

6. The display apparatus of claim 2, wherein in plan view, a subset of the second color filters are disposed over portions of the second black matrix overlapping the second holes.

7. The display apparatus of claim 2, wherein in plan view, portions of the second black matrix overlapping the second holes are covered by the second color filters.

8. The display apparatus of claim 2, wherein, in plan view, the second color filters completely cover the second holes.

9. The display apparatus of claim 2, wherein an area of each of first through holes corresponding to the first holes from among the first through holes is greater than an area of a corresponding one among the first holes.

10. The display apparatus of claim 2, wherein the first color filters fill the first through holes.

11. The display apparatus of claim 2, wherein the first black matrix and the second black matrix are integrally formed as a single body.

12. The display apparatus of claim 1, wherein an area of each of the first holes is identical to an area of each of the second holes.

13. The display apparatus of claim 1, wherein a shape of each of the first holes is identical to a shape of each of the second holes.

14. The display apparatus of claim 1, further comprising:

sensors disposed under the substrate to correspond to the first holes.

15. The display apparatus of claim 14, wherein the sensors are illuminance sensors.

16. The display apparatus of claim 14, wherein the sensors are infrared sensors.

17. The display apparatus of claim 1, wherein the display apparatus is one of smartphones, mobile phones, navigation devices, game consoles, TVs, vehicle head units, notebook computers, laptop computers, tablet computers, personal media players (PMP), or personal digital assistants (PDA).

18. A display apparatus comprising:

a first display area of a substrate;

a second display area of the substrate;

first pixel electrodes disposed in the first display area;

second pixel electrodes disposed in the second display area;

at least one of an illuminance sensor and an infrared sensor disposed in the first display area; and a pixel-defining layer contacting the first pixel electrodes and the second pixel electrodes and including:

first pixel openings in the first display area and corresponding to the first pixel electrodes;

second pixel openings in the second display area and corresponding to the second pixel electrodes;

first holes in the first display area and corresponding to spaces between the first pixel electrodes; and second holes in the second display area and corresponding to spaces between the second pixel electrodes.

19. The display apparatus of claim 18, wherein the display apparatus is one of smartphones, mobile phones, navigation devices, game consoles, TVs, vehicle head units, notebook computers, laptop computers, tablet computers, personal media players (PMP), or personal digital assistants (PDA).

* * * * *